United States Patent [19]

Motosugi et al.

[11] Patent Number: 5,257,531
[45] Date of Patent: Nov. 2, 1993

[54] APPARATUS FOR MONITORING MACHINING STATE OF DRILL

[76] Inventors: Masashi Motosugi, 1472-1 Mutsuura-Cho, Kanazawa-ku, Yokohama; Keiichi Suematsu, 259 Nisikase, Nakahara-ku, Kawasaki, both of Japan

[21] Appl. No.: 929,856

[22] Filed: Aug. 17, 1992

[51] Int. Cl.⁵ ............................................. G01H 11/00
[52] U.S. Cl. ........................................ 73/660; 340/683; 408/6
[58] Field of Search ................... 73/660; 340/680, 683; 408/6, 8, 11, 16, 95, 97

[56] References Cited

U.S. PATENT DOCUMENTS

| | | | |
|---|---|---|---|
| 3,912,925 | 10/1975 | Gaskell | 408/6 |
| 4,340,326 | 7/1982 | Buonauso et al. | 408/6 |
| 4,644,335 | 2/1987 | Wen | 73/660 |
| 4,918,616 | 4/1990 | Yoshimura et al. | 340/680 |
| 5,090,847 | 2/1992 | Gelston, II | 408/6 |

FOREIGN PATENT DOCUMENTS 805075 2/1981 U.S.S.R. .................... 73/660

Primary Examiner—Hezron E. Williams
Assistant Examiner—Nashmiya Ashraf
Attorney, Agent, or Firm—Edwin E. Greigg; Ronald E. Greigg

[57] ABSTRACT

An apparatus for monitoring a machining state of a drill according to this invention includes: a pressure-contact disk adapted to come into with a board or plate to be machined when a vertical movement plate moves downwardly so that a sensor can be mounted or attached with ease and there is no erroneous operation of the sensor resulting from aged deterioration or chips; a sensor provided on the vertical movement plate and adapted to transform vibration of the board to be machined, produced by machining by the drill, to an electric signal through the pressure-contact disk and the vertical movement plate; and a diagnostic apparatus body electrically connected to the sensor and adapted to analyze an electric signal from the sensor to diagnose the state of fracture or breakage of the drill.

3 Claims, 12 Drawing Sheets

APPARATUS FOR MONITORING MACHINING STATE OF DRILL

BACKGROUND OF THE INVENTION

This invention relates to an apparatus for monitoring a machining state of a drill of a machine tool for machining a board or plate to be machined such as a printed board, etc.

Generally, at the time of carrying out a boring or drilling work of a printed board, drills having an extremely fine diameter are used under the existing circumstances. For this reason, there results high percentage of occurrence of breakage during machining. It is therefore indispensable for protection of a printed board to accurately detect such a breakage to stop the operation of the machine tool. Further, it is desirable also from a viewpoint of improvement in the working efficiency to monitor a machining state of the drill at all times.

Meanwhile, conventionally, in the case of detecting a breakage of the drill, e.g., a light emitting element and a light receiving element for an optical fiber are oppositely provided at suitable portions of the circumferential side wall of a through-hole formed in the vertical movement plate of the machine tool, thus to directly detect a breakage of the drill.

However, the method of directly monitoring a breakage of the drill by means of an optical fiber sensor had the drawbacks that according as the diameter of the drill becomes fine, the processing (machining) or assembling accuracy may become extremely bad, and that any erroneous operation may take place by deviation of the optical axis resulting from aged deterioration, an erroneous sensing resulting from chips, or the like.

SUMMARY OF THE INVENTION

In view of the above drawbacks with the prior art, an object of this invention is to provide an apparatus for monitoring the machining state of a drill, which is capable of easily attaching a sensor, free from an erroneous operation of the sensor, capable of stably and repeatedly detecting AE signals, and capable of easily detecting cutting portions of a multi-layer printed board.

DESCRIPTION OF THE PREFERRED EMBODIMENTS

This invention will now be described with reference to the attached drawings in connection with several preferred embodiments.

Figure 1:
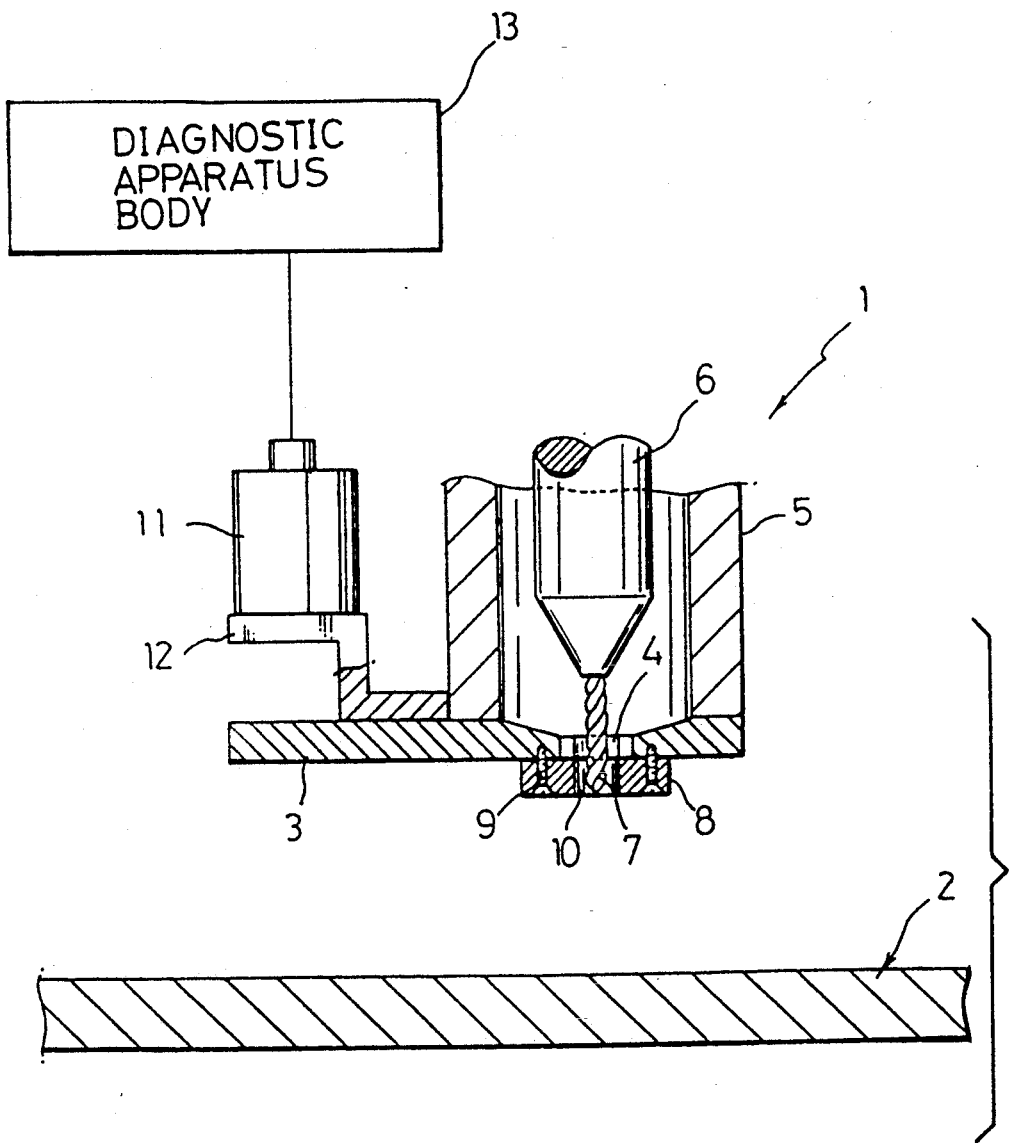
FIGS. 1 and 2 are schematic explanatory views showing a first embodiment of this invention where a sensor is mounted on an upper surface of the vertical movement plate.
Figure 2:
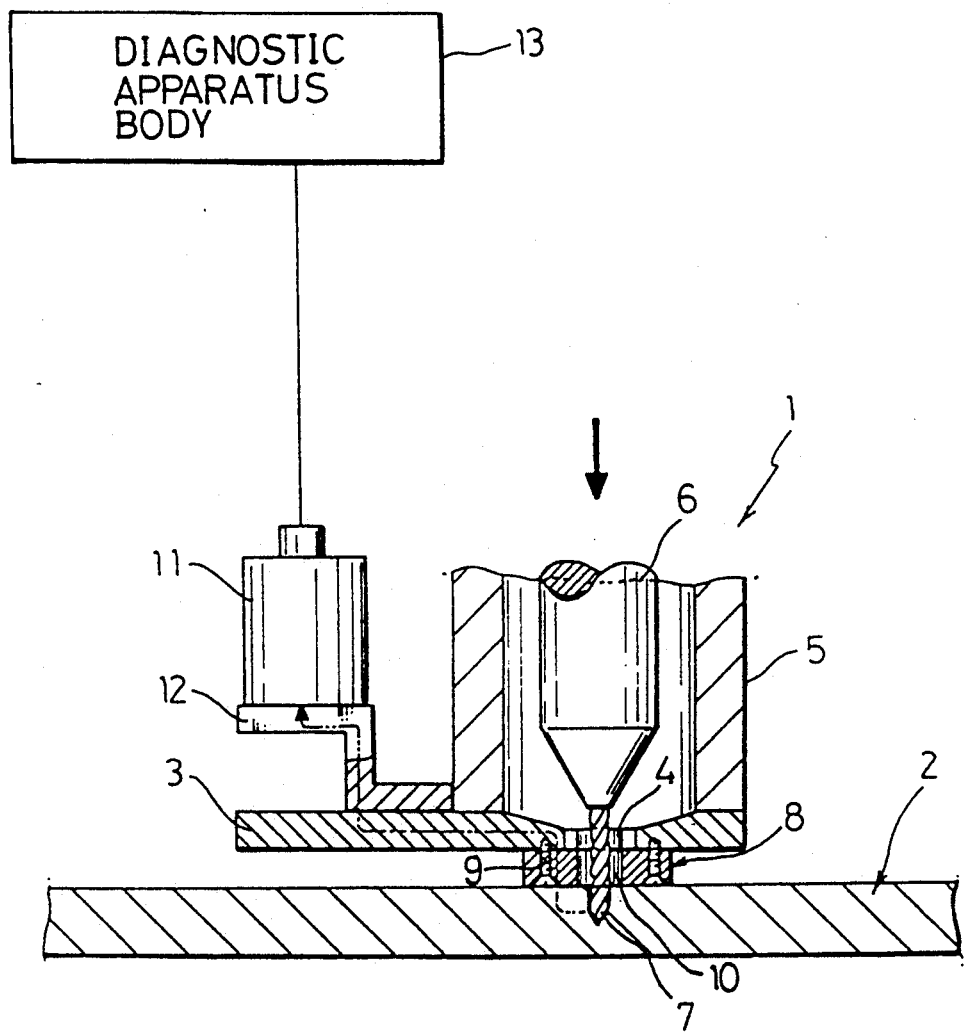
Figure 3:
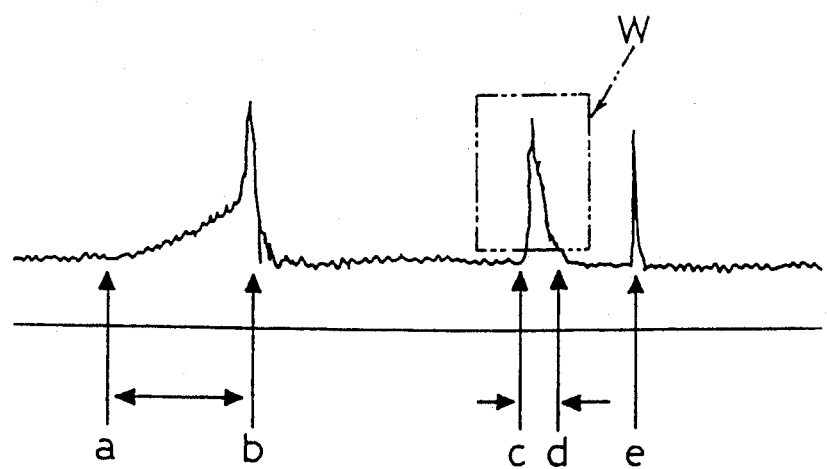
FIG. 3 is a schematic explanatory view showing the operation for monitoring the machining state of a drill in the first embodiment.

In a first embodiment shown in FIGS. 1 to 3, reference numeral 1 denotes the main part of a machine tool used for carrying out drilling or boring work at the surface portion of a board or plate to be machined, i.e., a printed board 2 in this embodiment.

Reference numeral 3 denotes a vertical movement plate horizontally opposite to the printed board 2, and a through-hole 4 is formed at a suitable portion of the vertical movement plate 3. Reference numeral 5 denotes a vertical movement cylindrical body (pressure foot) attached in a vertical state on the upper surface of the vertical movement plate 3, and adapted for absorbing chips. The lower end portion of the vertical movement cylindrical body 5 is integrally provided on the vertical movement plate 3 so as to surround the through-hole 4.

Reference numeral 6 denotes a spindle provided so that it can move upwardly and downwardly (i.e. vertically) within the vertical movement cylindrical body 5, and rotating at a high speed with a drive force of a drive motor (not shown) as a power source. A drill 7 for machining (drilling or boring) the printed board 2 is integrally attached to the front end portion of the spindle 6. The bearing portion of the spindle 6 is of the air-bearing system so that the spindle 6 can rotate at high speed.

Reference numeral 8 denotes a pressure-contact disk fixedly attached on the lower surface of the vertical movement plate 3, and adapted to come into contact with the upper surface of the printed board 2 when the vertical movement plate 3 moves downwardly. The pressure-contact disk 8 is in a cylindrical form in this embodiment, but may be in a square form.

At portions close to the peripheral edge portion of the pressure-contact disk 8, a plurality of fitting holes 9 for fixture are formed. Further, at the central portion thereof, a center hole 10 for drill of a relatively large diameter is formed. It is to be noted that the contact-pressure disk 8 may be also suitably attached by caulking, and may be molded integrally with the vertical movement plate 3.

Reference numeral 11 denotes a sensor attached to the projected upper surface of the vertical movement plate 3 through a support plate 12, and adapted to receive at least vibration of the printed board 2 produced by cutting by the drill 7 to transform it to an electric signal. As this sensor, an AE sensor is used in this embodiment. The term "AE" will now be briefly described. Generally, "AE" is the phenomenon that when solid is deformed or destroyed, a strain energy which has been stored until that time is released, whereby elastic wave (ultrasonic wave, etc.) is produced. Accordingly, "AE sensor" mentioned here is a transducer adapted to receive an elastic wave such as an ultrasonic wave, etc. produced when a board or plate to be machined is machined by means of a drill to transform it to an electric signal. It is to be noted that the sensor 11 may be directly attached to the vertical movement plate 3.

Additionally, an acceleration sensor may be used as the sensor.

Reference numeral 13 denotes a diagnostic apparatus body electrically connected to the sensor 11, and adapted to analyze an electric signal from the sensor as a change of voltage to diagnose the state of fracture or breakage of the drill during machining. This diagnostic apparatus body 13 includes a Central Processing Unit (CPU). Although specifically not shown, a display unit and/or a printer are connected to the CPU.

In the above-mentioned configuration, as shown in FIG. 2, the vertical movement plate 3 moves first downwardly, so the lower surface of the pressure-contact disk 8 comes into contact with the surface of the printed board 2. Then, the spindle 6 begins moving downwardly while rotating at a high speed. Thus, drilling or boring work of the printed board 2 is carried out by the drill 7. At this time, an AE signal (vibration) is produced by machining by the drill 7. During machining, that vibration is propagated through the pressure-contact disk 8 and the vertical movement plate 3 to the AE sensor 11. The AE sensor 11 receives that vibration thus propagated to transform it to an electric signal. This electric signal is analyzed and grasped as a change of voltage by means of the diagnostic apparatus body. Thus, that waveform is diagnosed in the monitored state.

The above diagnosis is carried out by observing at all times the waveform shown in FIG. 3 as indicated by the needle of a seismometer by using a display unit, etc. Namely, reference symbol a indicates the time point when the vertical movement plate 3 moves downwardly, so the pressure-contact disk 8 begins coming into contact with the printed board 2, and reference symbol b indicates the time point when the pressure-contact disk 8 is completely tightly in contact with the printed board 2. For the time period between times indicated by the reference symbols a and b, an increase of noise by suction of the vertical movement cylindrical body 5 can be observed. Further, for the time period between times indicated by reference symbols c and d, an AE signal at the time of machining by the drill 7 can be observed. Since the pressure-contact disk 8 is just fit on the surface of the printed board 2 for the time period between times indicated by the reference symbols b and c, its waveform is an ordinary one. Reference symbol e indicates the time point when the pressure-contact disk 8 leaves or drifts away from the printed board 2, and the waveform (mechanical sound) at this time is as shown in the figure. Assuming now that the time period from the time indicated by reference symbol a to the time indicated by reference symbol e is one cycle, if an approach is employed to monitor whether or not a waveform W encompassed by phantom lines exists between the time period between times indicated by the reference symbols c and d, it is possible to monitor fracture or breakage of the drill.

Other embodiments of this invention shown in FIGS. 4 to 12 will now be described. It is to be noted that, in the description of these embodiments, the same reference numerals are respectively attached to the same portions or parts of those of the above-described first embodiment of this invention, and their repetitive explanation will be omitted.

Figure 4:
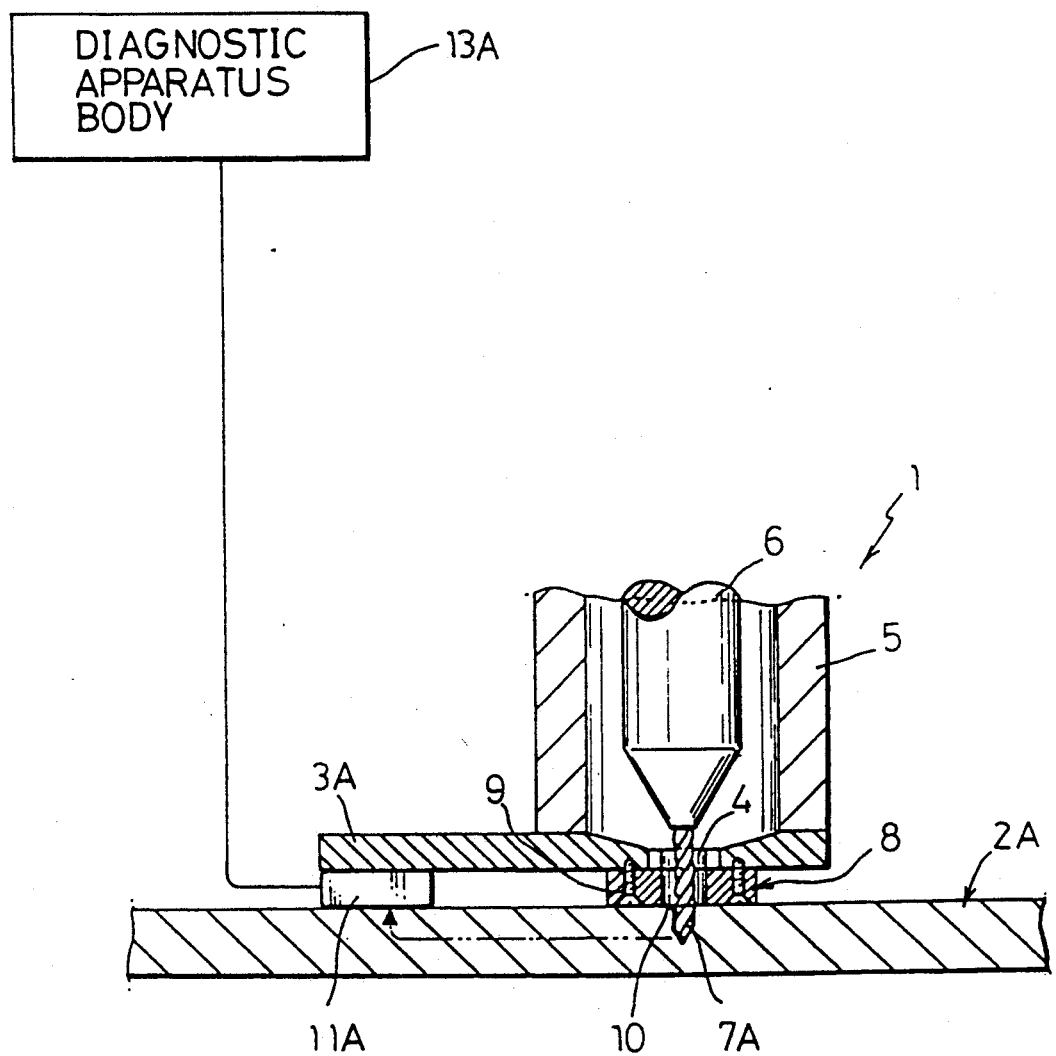
FIG. 4 is a schematic explanatory view showing a second embodiment of this invention where a sensor is attached to a lower surface of the plate.

The second embodiment shown in FIG. 4 mainly differs from the above-described embodiment of this invention in the mounting portion of the sensor. Namely, a sensor 11A is fixedly mounted on the lower surface of a vertical movement plate 3A. When the vertical movement plate 3A moves downwardly, the sensor 11A directly comes into contact with the surface of a printed board 2A. When the drill machining state monitoring apparatus is constructed in this way, AE signals (vibrations) at the time of machining and during machining by a drill 7A are propagated directly from the printed board 2A to the AE sensor 11A. Accordingly, a diagnostic apparatus body 13A can precisely analyze and grasp a change of voltage in the same manner as in the invention of the first embodiment.

Figure 5:
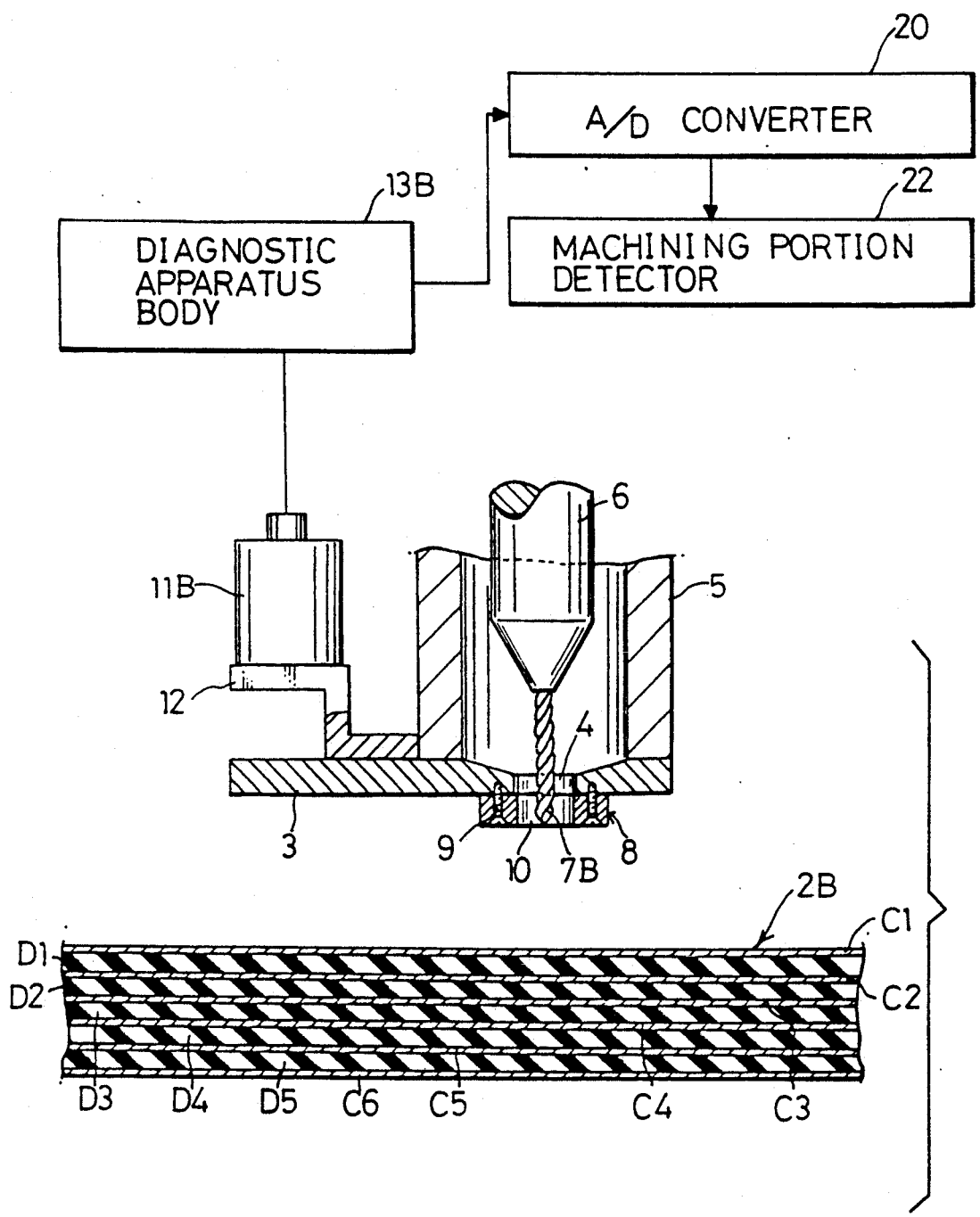
FIGS. 5 and 6 are schematic respective explanatory views showing a third embodiment of this invention.
Figure 6:
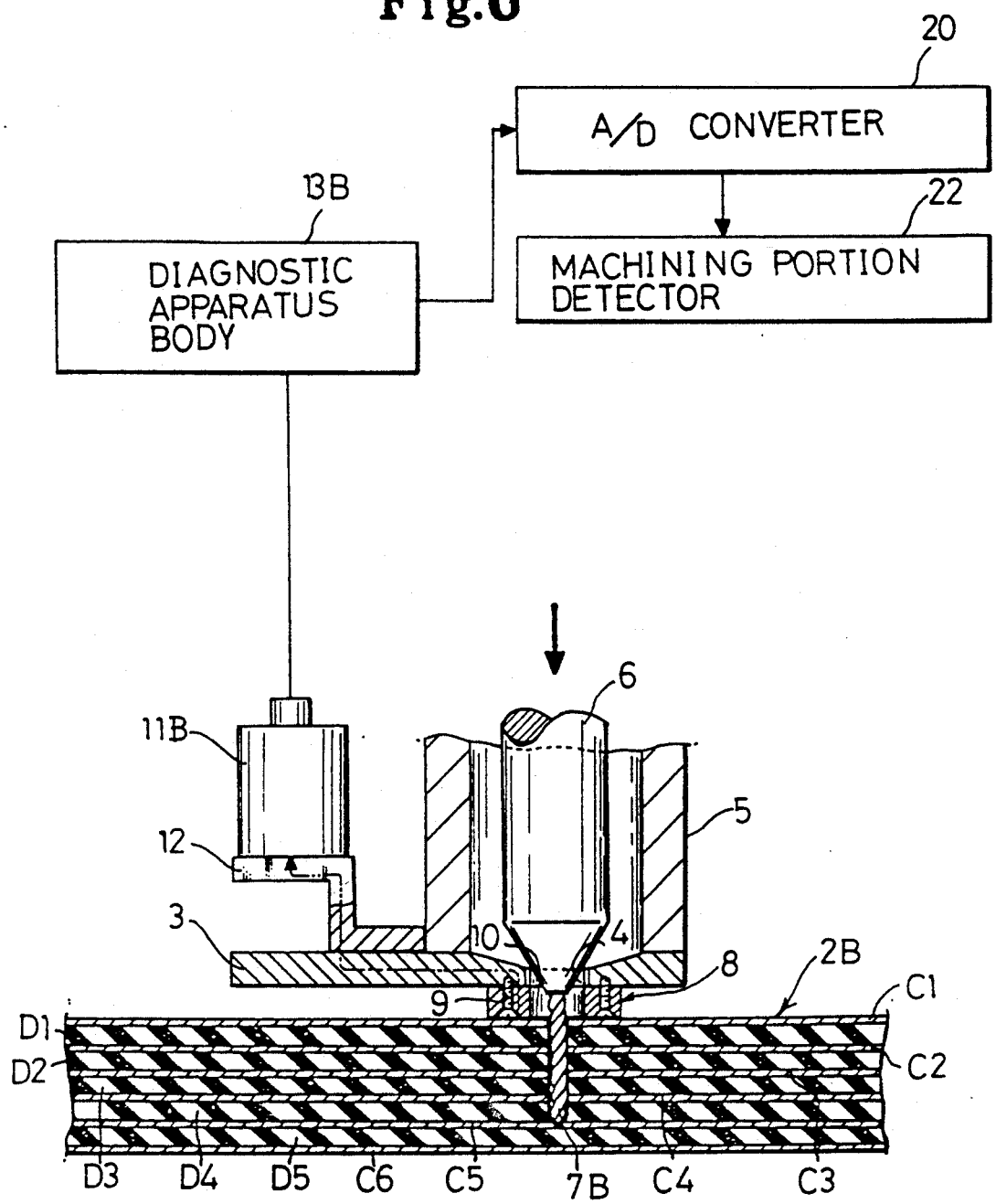
Figure 7:
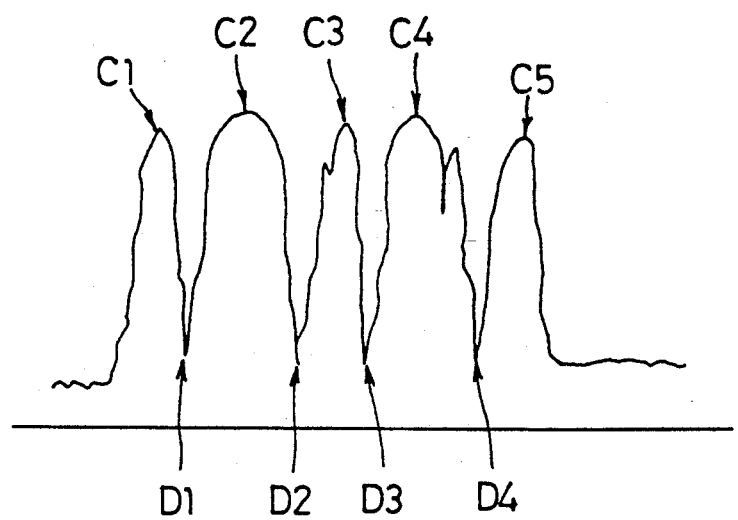
FIG. 7 is a schematic explanatory view showing the operation for monitoring the machining state of a drill in the third embodiment.

The third embodiment shown in FIGS. 5 to 7 mainly differs from the above-described embodiments of this invention in that a machining portion detector 22 for counting electric signals indicating the positions of conductive layers C1, C2, C3, C4 and C5 of a multi-layer printed board 2B is electrically connected to a diagnostic apparatus body 13B through an analog/digital converter 20.

When the drill machining state monitoring apparatus is constructed as above, in machining the multi-layer printed board 2B by using a drill 7B, an approach is employed to count electric signals indicating the positions of conductive layers by using the machining portion detector 22 on the basis of the discrimination between machining waves of conductive layers C1, C2, C3, C4 and C5 and insulating layers D1, D2, D3 and D4 of the multi-layer printed board 2B as shown in FIG. 7 of elastic waves captured by an AE sensor 11B, thereby making it possible to detect an actual position of the drill 7B or the machining portion of the multi-layer printed board 2B. Accordingly, in this embodiment, it is possible to send or feed the drill 7B into a desired position of the multi-layer printed board 2B.

Figure 8:
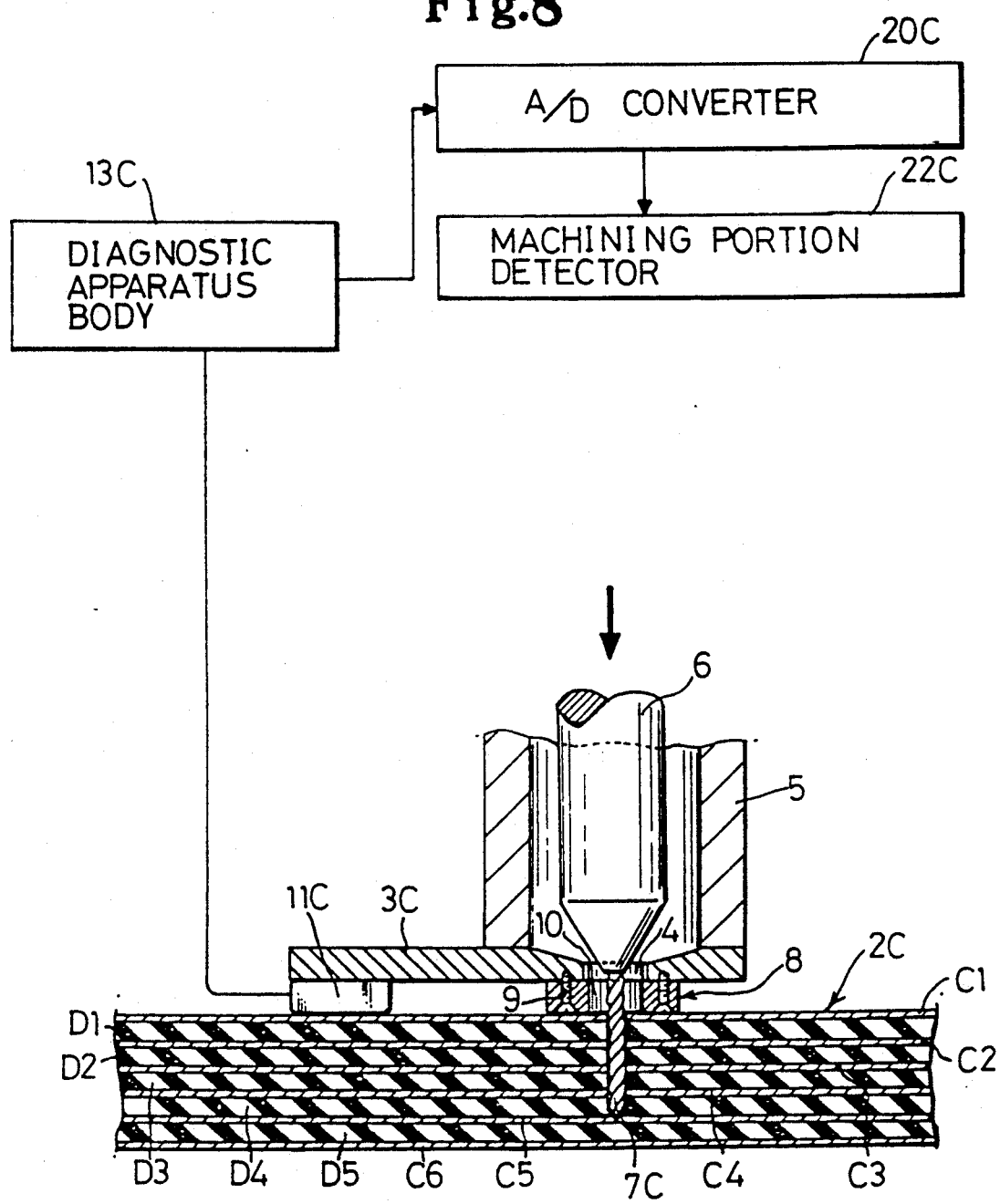
FIG. 8 is a schematic explanatory view showing a fourth embodiment of this invention.

The fourth embodiment shown in FIG. 8 mainly differs from the above-described embodiments of this invention in that a sensor 11C is fixedly attached on the lower surface of a vertical movement plate 3C, and the sensor 11C is thus caused to directly come into contact with the surface of a multi-layer printed board 2C when the vertical movement plate 3C moves downwardly, and that a machining portion detector 22C for counting electric signals indicating the positions of conductive layers C1, C2, C3, C4 and C5 of the multi-layer printed board 2C through an analog/digital converter 20C.

Figure 9:
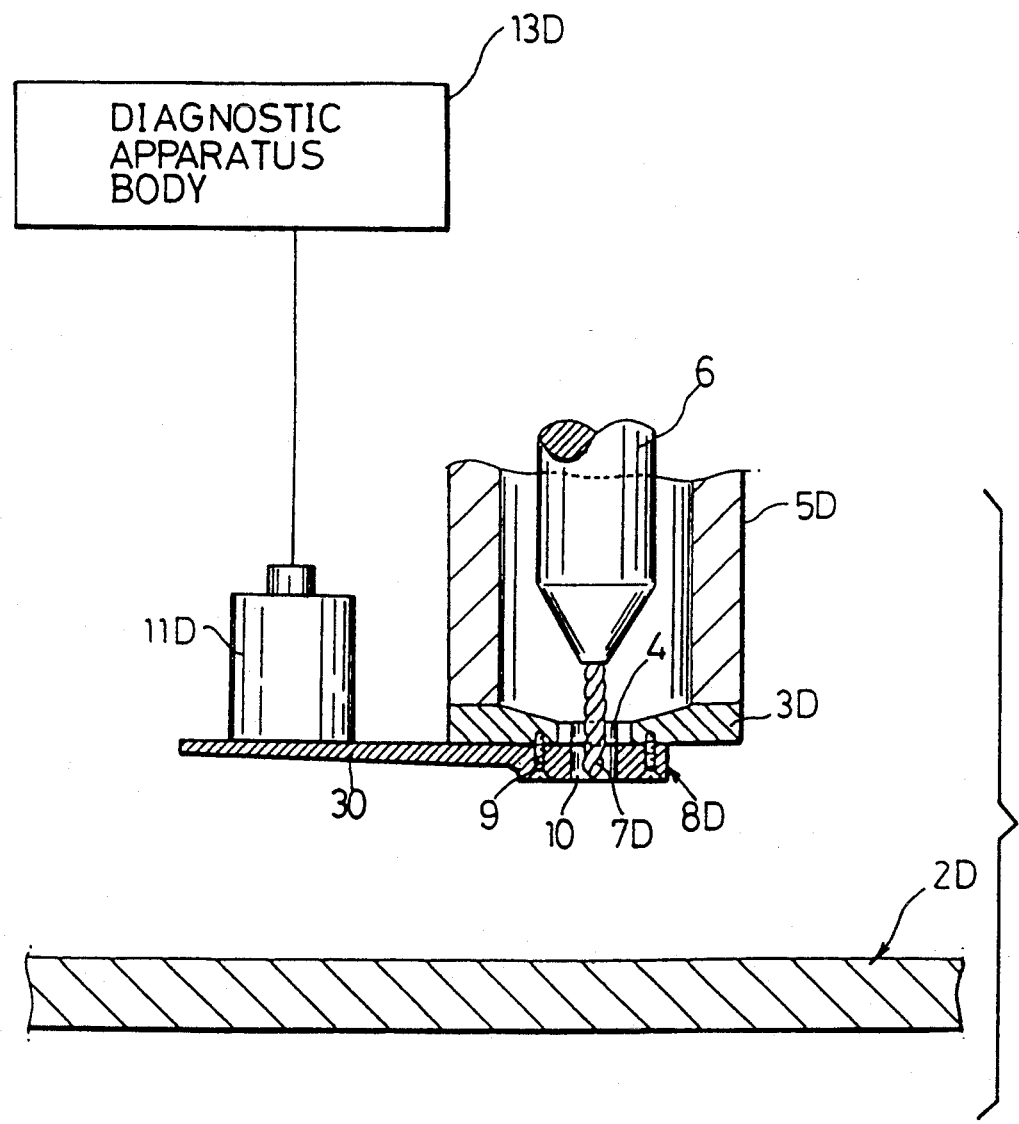
FIGS. 9 and 10 are respective schematic explanatory views showing a fifth embodiment of this invention where a sensor mounted directly on an upper surface of the plate.
Figure 10:
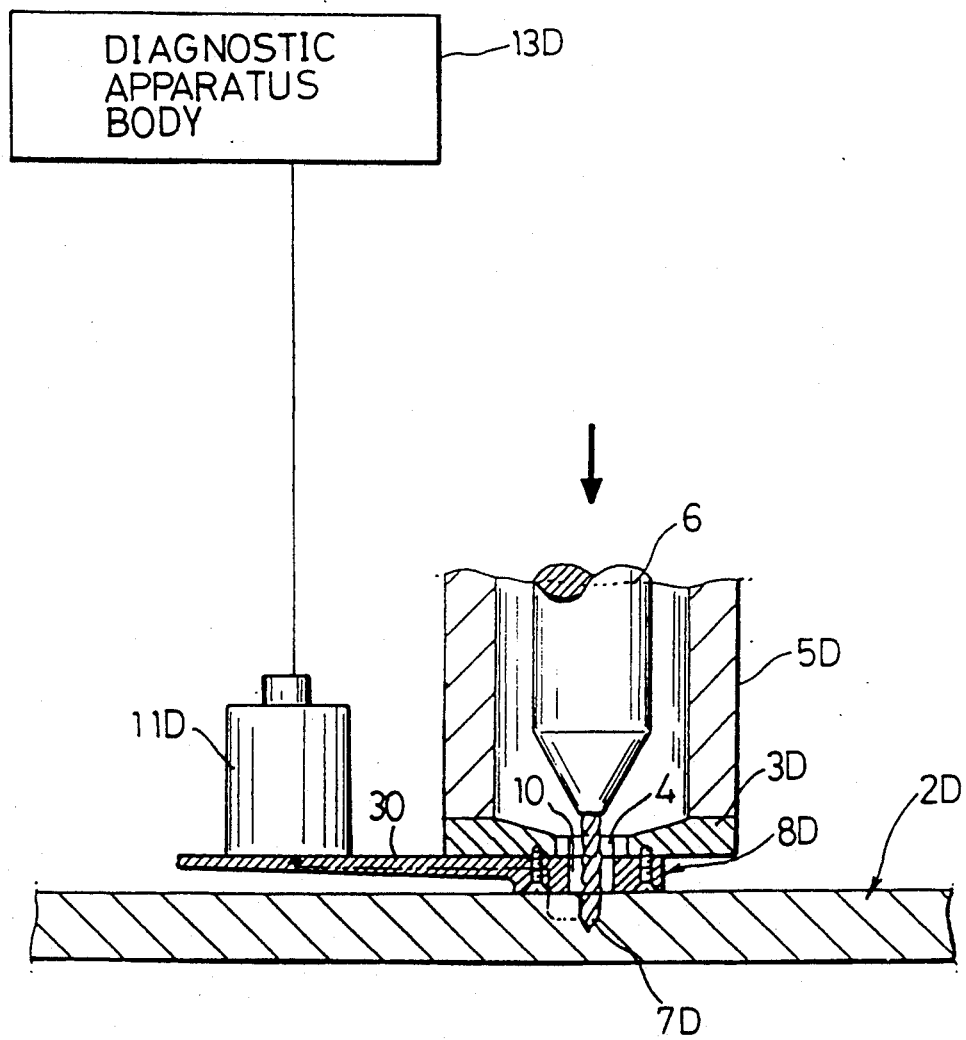

The fifth embodiment shown in FIGS. 9 and 10 mainly differs from the above-described embodiments of this invention in that a vertical movement plate 3D is caused to have the same dimension (diameter) as that of a vertical movement cylindrical body 5D, and that a support arm 30 projected from the vertical movement cylindrical body 5D is formed at the pressure-contact disk 8D, and an AE sensor 11D is attached on the upper surface of the support arm 30. When the drill machining state monitoring apparatus is constructed as above, AE signals (vibrations) at the time of machining and during machining by a drill 7D are propagated from a printed board 2D to the AE sensor 11D through the pressure-contact disk 8D. Accordingly, a diagnostic apparatus body 13D can more precisely analyze and grasp a change of voltage than that of the invention of the first embodiment.

Figure 11:
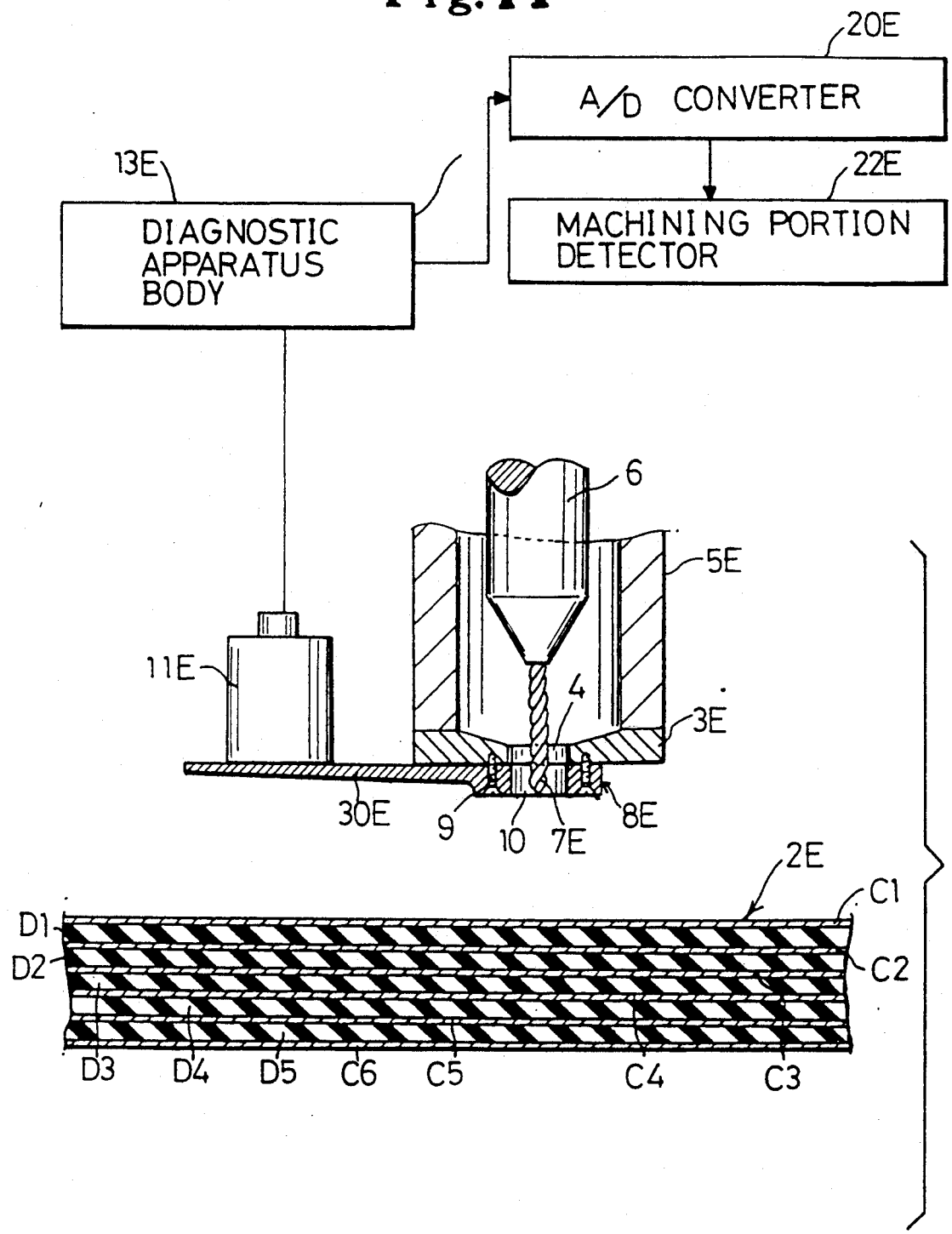
FIGS. 11 and 12 are respective schematic respective explanatory views showing a sixth embodiment of this invention.
Figure 12:
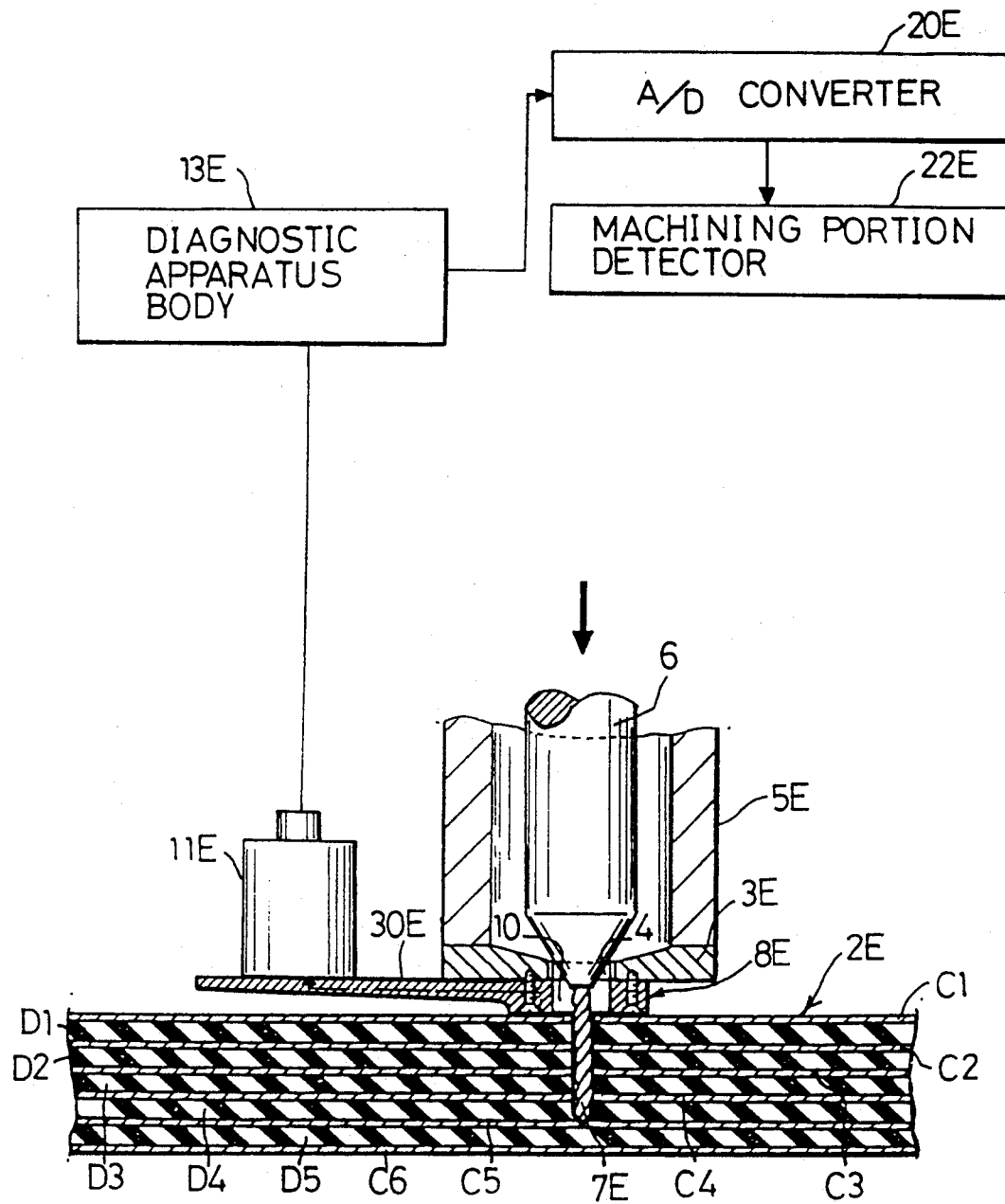

The sixth embodiment shown in FIGS. 11 and 12 mainly differs from the above-described embodiments of this invention in that a vertical movement plate 3E is caused to have the same dimension (diameter) as that of a vertical movement cylindrical body 5E, and that a support arm 30E projected from a vertical movement cylindrical body 5E is formed at a pressure-contact disk 8E, and an AE sensor 11E is attached on the upper surface of the support arm, and that a machining portion detector 22E for counting electric signals indicating the positions of conductive layers C1, C2, C3, C4 and C5 of a multi-layer printed board 2E through an analog/digital converter 20E.

When the drill machining state monitoring apparatus is constructed as above, AE signals (vibrations) at the time of machining and during machining by a drill 7E are propagated from the printed board 2E to the AE sensor 11E through the pressure-contact disk 8E. Further, an approach is employed to count electric signals indicating the positions of conductive layers by using the machining portion detector 22E on the basis of discrimination between machining waves of conductive layers C1, C2, C3, C4 and C5 and insulating layers D1, D2, D3 and D4 of elastic waves captured by the AE sensor 11E when machining the multi-layer printed board 2E by using the drill 7E, thereby making it possible to detect an actual position of the drill 7E or the machining portion of the multi-layer printed board 2E.

Accordingly, this embodiment can exhibit the effects or advantages with the above-described third and fifth embodiments.

As is clear from the foregoing description, this invention provides effects or advantages as recited below (1) It is unnecessary to implement machining to the vertical movement plate, etc. in order to attach a receiving element on the vertical movement plate, etc. with good accuracy. Accordingly, it is possible to simply or easily attach the sensor to the vertical movement plate or the pressure-contact disk.

(2) There is no erroneous operation of the sensor resulting from aged deterioration or chips.

(3) It is possible to stably and repeatedly detect AE signals. Namely, it is possible to detect AE signals precisely at all times as a signal irrespective of the form of a drill, or a board or plate to be machined.

(4) It is possible to easily detect the machining portion of the multi-layer printed board.

When is claimed is:

1. An apparatus for monitoring a machining state of a drill, comprising a vertical movement plate (3) having an upper surface and a lower surface, a through-hole (4) in said plate (3), a pressure contact disk attached to said lower surface of said plate (3), said pressure contact disk having an aperture coaxial with said through-hole (4) in said plate (3), an AE sensor secured to an extending portion of said plate (3), a diagnostic apparatus body electrically connected to said AE sensor and adapted to analyze an electrical signal output of said AE sensor due to input vibrations produce during drilling of a print circuit board in order to determined a drilling state of a drill, and a machine portion detector for detecting and counting electric signals to indicate a position during drilling different layers of a multi-layer printed board in which said machine portion detector is connected to said diagnostic apparatus via an analog/digital converter.

2. An apparatus as set forth in claim 1 in which said AE sensor is secured to said lower surface of said plate (3) whereby the AE sensor will rest upon said print circuit board during drilling of holes in the print circuit board.

3. An apparatus as set forth in claim 1 in which aid AE sensor is secured to an upper surface of said extended arm of said plate (3).

* * * * *